United States Patent [19]

Turner

[11] Patent Number: 5,220,533
[45] Date of Patent: Jun. 15, 1993

[54] METHOD AND APPARATUS FOR PREVENTING OVERERASURE IN A FLASH CELL

[75] Inventor: John E. Turner, Santa Cruz, Calif.

[73] Assignee: Altera Corporation, San Jose, Calif.

[21] Appl. No.: 788,607

[22] Filed: Nov. 6, 1991

[51] Int. Cl.⁵ .............................................. G11C 11/40
[52] U.S. Cl. ..................................... 365/218; 365/185
[58] Field of Search ................ 365/218, 184, 185, 900

[56] References Cited

U.S. PATENT DOCUMENTS

| | | | |
|---|---|---|---|
| 4,903,236 | 2/1990 | Nakayama et al. | 365/900 |
| 4,996,571 | 2/1991 | Kume et al. | 365/218 |
| 5,097,444 | 3/1992 | Fong | 365/218 |
| 5,122,985 | 6/1992 | Santin | 365/185 |
| 5,132,935 | 6/1992 | Ashmore, Jr. | 365/218 |

FOREIGN PATENT DOCUMENTS 3230566  10/1991  Japan .

OTHER PUBLICATIONS

Lai, S., IEDM Short Course on Non-Volatile Memories, Flash Memories, San Francisco, Calif., Dec. 9, 1990.

Primary Examiner—Eugene R. LaRoche
Assistant Examiner—Tan Nguyen
Attorney, Agent, or Firm—Jeffrey H. Ingerman

[57] ABSTRACT

A method and apparatus for erasing Flash EPROM cells that avoids overerasure is provided. A high-impedance device is placed between the drain of the cell and the high-voltage supply used to erase the cell. As soon as the cell enters the onset of depletion and begins to conduct, most of the high voltage is dropped across the high-impedance device, leaving insufficient potential across the cell for Fowler-Nordheim tunneling to continue. The erase process is thus self-limiting. The process can be used on a chain or array of EPROM cells, with erasure stopping when any one of the cells conducts. Bias differences between erase and read modes assure that the cell that first goes into depletion is not in depletion in normal operation.

20 Claims, 2 Drawing Sheets

METHOD AND APPARATUS FOR PREVENTING OVERERASURE IN A FLASH CELL

BACKGROUND OF THE INVENTION

This invention relates to programmable read-only memory cells of a type that can be electrically erased in a "flash" or bulk mode, and particularly to preventing overerasure of one-transistor Flash EPROM or EEPROM cells.

Erasable programmable read-only memory (EPROM) technology is well known for use in both memory and programmable logic applications. In particular, EPROMs are implemented using floating gate field effect transistors in which the binary states of the EPROM cell are represented by the presence or absence on the floating gate of sufficient charge to prevent conduction even when a normal high signal is applied to the gate of the EPROM transistor.

EPROMs are available in several varieties. In the traditional and most basic form, EPROMs are programmed electrically and erased by exposure to ultraviolet light. These EPROMs can be referred to as ultraviolet erasable programmable read-only memories ("UVEPROMs"). UVEPROMs are programmed by running a high current between the drain and the source of the UVEPROM transistor while applying a positive potential to the gate. The positive potential on the gate attracts energetic ("hot") electrons from the drain-to-source current, which jump onto the floating gate in an attempt to reach the gate and become trapped on the floating gate.

Another form of EPROM is the electrically erasable programmable read-only memory ("EEPROM" or "E²PROM"). EEPROMs are programmed and erased electrically based on a phenomenon known as Fowler-Nordheim tunneling.

Still another form of EPROM is "Flash EPROM," which is programmed using hot electrons like a traditional EPROM (UVEPROM) and erased using Fowler-Nordheim tunneling like an EEPROM. Both Flash EPROM and EEPROM can be erased in a "flash" or bulk mode in which all cells in an array can be erased simultaneously using Fowler-Nordheim tunneling, and will be referred to hereinafter as "Flash cells" or "Flash devices."

UVEPROM and EEPROM have been used for both memory applications and programmable logic applications. To date, however, Flash devices have been used primarily for memory applications. One obstacle to using Flash devices is the phenomenon of overerasure. Overerasure is the result of continuing the Fowler-Nordheim erase process too long, so that too much charge is removed from the floating gate, with the result that the Flash transistor goes into depletion mode, in which it is always conducting (unless the gate-to-source voltage goes negative).

In a programmable logic device ("PLD") or memory chip in which there is an overerased Flash transistor, the leakage current resulting from the depletion mode operation of that transistor can interfere with accurate reading of the states of neighboring cells in the array. This can be cured by having in each cell a second "select" transistor, allowing the selection or deselection of a particular device for reading. Many Flash memory applications employ such select transistors. However, in logic applications, the use of such a transistor consumes chip area, and also affects array speed.

Another solution frequently employed with Flash devices is to use an "intelligent" erasing algorithm in which the device is repeatedly erased a small amount and then verified to see if the cell threshold has shifted the desired amount. However, such a technique can be time-consuming, and adds to programming complexity.

Accordingly, it would be desirable to be able to provide programming methods or apparatus for single-transistor Flash cells in which susceptibility to overerasure is reduced or eliminated.

It would also be desirable to be able to provide a programmable logic array of one-transistor Flash cells.

SUMMARY OF THE INVENTION

It is an object of this invention to provide programming methods or apparatus for single-transistor Flash cells in which susceptibility to overerasure is reduced or eliminated.

It is also an object of this invention to provide a programmable logic array of one-transistor Flash cells.

In accordance with this invention, there is provided a method of erasing a programmed Flash cell and stopping erasure of the cell on the onset of conduction by the cell, the cell having a gate, a source, a drain and a floating gate from which charge must be removed by placing a high potential difference thereacross to eras the cell. The method includes applying ground potential to the gate and the source and applying a high positive potential to the drain through a high-impedance device connected to the drain and having an impedance much greater than that of the cell. The high positive potential causes electrons to flow off the floating gate to the drain and through the high-impedance device. When enough electrons have been removed from the floating gate, the cell begins to conduct, and current flows through the high-impedance device and the cell. The current drops most of the high potential across the high-impedance device, with insufficient potential remaining across the floating gate to remove additional electrons. Thereby, erasure is stopped at onset of conduction by the cell.

A column of Flash devices, all of which are programmed, can be erased in this way by applying high potential to the drain line of the column through a high-impedance device, with the source line of the column grounded. An entire array of Flash devices, again all of which are programmed, can also be erased by connecting the drain lines of all columns to the high potential through the high-impedance device, and the source lines of all columns to ground. In both cases, once any transistor in the column or array begins to conduct, most of the high potential being applied will be dropped across the high-impedance device, so that the potential across the floating gate of each transistor will be too low for further removal of electrons from the floating gate.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Fowler-Nordheim tunneling occurs across thin oxides (less than about 110 Å) at potentials (e.g., 7–8 Mv/cm) above the normal operating potentials of most electronic devices. In EEPROM devices, oxides of such thickness are grown between the floating gate and the write/erase junction. In Flash EPROM devices such oxides may be grown between the floating gate and the erase/read junction, and other implementations are possible.

Figure 1:
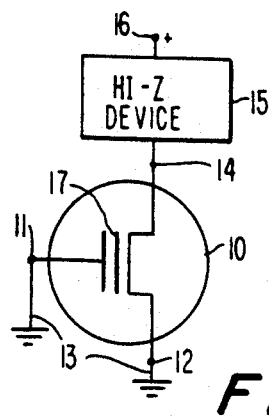
FIG. 1 is a schematic diagram of a Flash EPROM cell connected for erasure in accordance with the present invention.

In the simplest preferred embodiment of the present invention, a single such Flash EPROM cell 10 is connected for erasure purposes as shown in FIG. 1. Gate 11 and source 12 of cell 10 are connected during erasure to a supply 13 of ground potential. Drain 14 is connected, again solely for erasure purposes, to high-impedance device 15 (having much higher impedance than the impedance of the drain-to-source channel of cell 10) which in turn is connected to a supply 16 of high voltage (e.g., from about 13 volts to about 15 volts).

With cell 10 so configured for erasure, no current flows through cell 10 from drain 14 to source 12 because cell 10 is programmed. The potentials applied to gate 11, source 12 and drain 14 are such that Fowler-Nordheim tunneling removes charge from floating gate 17. Eventually, sufficient charge is removed from floating gate 17 that cell 10 begins to enter depletion mode. At that point, cell 10 begins to conduct between drain 14 and source 12. Although that initial current is small (e.g., about 1 μa), any current is sufficient to cause a voltage drop across high-impedance device 15 and the drain-to-source channel of cell 10. Because device 15 has a much higher impedance than the drain-to-source channel of cell 10, most of the voltage drop occurs across device 15. As a result, the voltage across cell 10 drops below the threshold needed to sustain Fowler-Nordheim tunneling (about 7–8 Mv/cm), and no additional charge is removed from the floating gate. The erase process is thus self-limiting, as it stops itself just at the onset of depletion.

It is undesirable for the cell to actually go into depletion mode, because that would clearly affect normal operations. During erase, positive coupling to the floating gate from the erase/read junction is greater in the erase mode than in the read mode. This will cause the cell to enter depletion mode sooner in the erase mode than in normal operations where a lower read voltage is applied to the erase/read node. The net result is a positive threshold when the cell is biased for read operation.

Greater operating margins in normal operations can be more definitely assured by one of several alternative modes of operation. A positive voltage bias can be applied to the drain or source during erase or read, respectively. Applying the appropriate voltage in either case will provide sufficient margin from the depletion turn-on point. Margin is necessary to account for variations with ambient temperature and to account for internal ground bus voltage drop.

Figure 2:
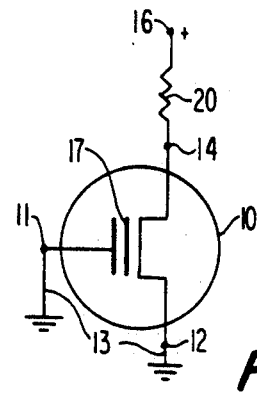
FIG. 2 is a schematic diagram of the Flash EPROM cell of FIG. 1 in which the high-impedance device is a resistor.
Figure 2A:
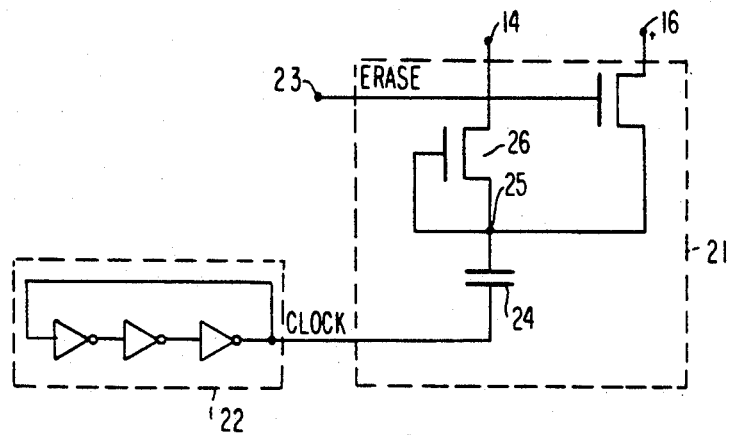
FIG. 2A is a schematic diagram of a circuit that can be used as the high-impedance device.

High-impedance device 15 can be any device or circuit having sufficient impedance to cause a sufficient voltage drop to stop Fowler-Nordheim tunneling at the onset of conduction (when the cell just enters depletion). As shown in FIG. 2, device 15 may be a simple resistor 20 having a resistance of at least about 1 MΩ. Alternatively, any other suitable impedance device or circuit may be used. For example, as shown in FIG. 2A, device 15 may be a capacitive pumped circuit 21 driven, e.g., by an on-chip oscillator 22. In circuit 21, the ERASE signal input at node 23 is held high, and the CLOCK signal output by oscillator 22 is preferably a square wave with a frequency of about 10 MHz. On each rising edge of CLOCK, charge is couple across capacitor 24 to node 25. When the resulting potential on node 25 is pumped up above the threshold voltage of diode-connected transistor 26, the potential on node 14 begins to increase (the desired result until cell 10 conducts) until transistor 27 is turned on, conducting programming voltage from supply 16 to node 25, which pumps the potential on node 14 even higher. The potential increases on each rising edge of CLOCK until it saturates at or just above the potential of supply 16.

Figure 3:
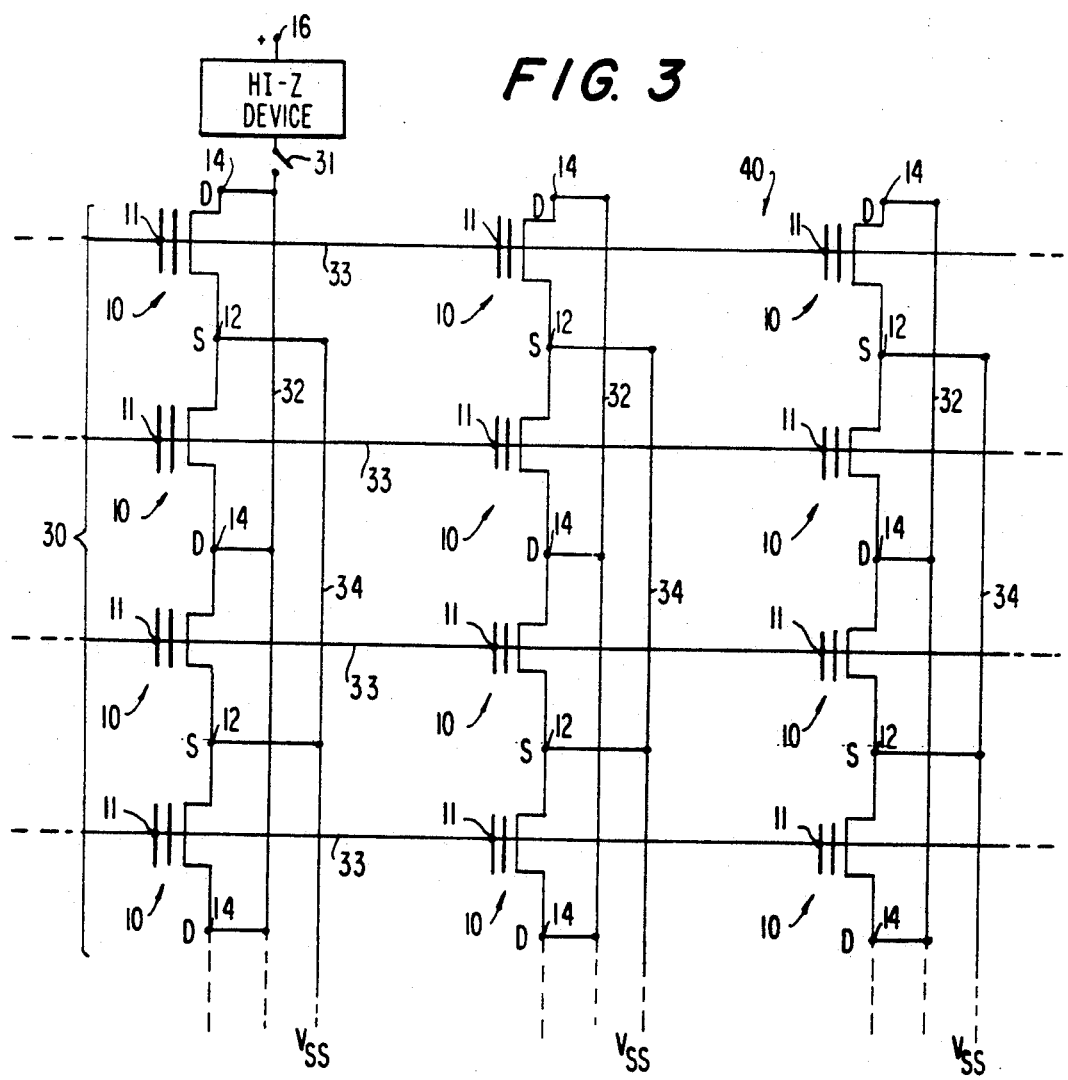
FIG. 3 is a schematic diagram of a portion of an array of Flash EPROM transistors in which one column is connected for erasure in accordance with the present invention.

FIG. 3 shows how the circuit and method of the present invention can be used in a chain of Flash EPROM devices to bulk erase the entire chain. As shown in FIG. 3, chain 30 is part of a larger array 40 of Flash EPROM devices 10, such as may be found in a PLD, although chain 30 could be a simple linear chain.

In order for the present invention to function in a chain such as chain 30, all EPROMs 10 in chain 30 must first be programmed—i.e., non-conducting. If any cell 10 starts out conducting, the high voltage from supply 16 will immediately be divided between device 15 and the conducting cell or cells 10. Assuming all cells 10 are programmed (either that was their desired logical condition, or the unprogrammed cells were programmed for the purpose of the bulk erase procedure), switch 31 is closed to bring high-impedance device 15 into contact with drain line 32 (device 15 is not normally used for logical operations). Although switch 31 is shown as a simple switch, in practice it would more likely be an electronically controlled device, such as a simple transistor or some other type of circuit.

Word lines 33, connected to gates 11, and $V_{ss}$ lines 34, connected to sources 12, are then connected to ground. Fowler-Nordheim tunneling proceeds in all cells 10 of chain 30 until one of cells 10 reaches the onset of depletion and conducts. The voltage applied at supply 16 then drops across device 15, and erasure is stopped for all cells 10 as the voltage required is no longer present at the respective erase junctions. At that point, switch 31 is opened. Although some variation is inevitable, it is assumed that all cells 10 in chain 30 have similar depletion thresholds, so that all cells 10 are substantially erased when the first cell is erased. Proper tolerances in manufacturing can assure sufficient similarity in the depletion thresholds.

As in the case of a single cell 10, high-impedance device 15 can be any device or circuit providing the desired impedance. Although multiple cells 10 are involved in the case of chain 30, the preferred impedance for device 15 is again at least about 1 MΩ.

Figure 4:
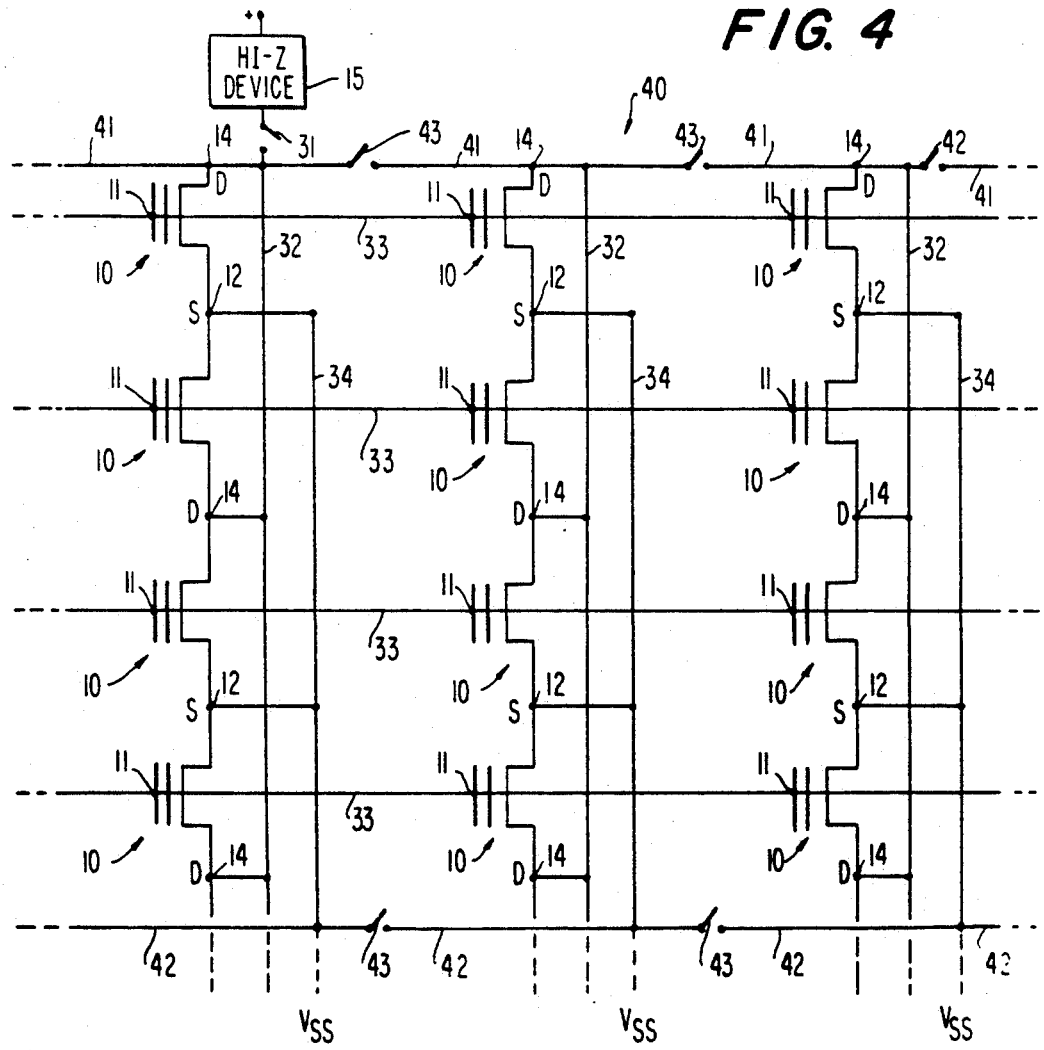
FIG. 4 is a schematic diagram of the array portion of FIG. 3 in which all columns are connected for erasure in accordance with the present invention.

An entire array 40 such as a PLD, where each chain 30 is a column of the array, can be erased on a chain-by-chain basis with a separate device 15 for each chain 30. However, FIG. 4 shows how the present invention can be used with an entire array 40 using a single high-impedance device 15. The entire-array case is similar to the chain case of FIG. 3, including the requirement that all cells 10 start out programmed, except that in addition to switch 31 for switching device 15 into the circuit, drain line interconnections 41 and source line interconnections 42, controlled by switches 43, are also provided, and switches 43 must be closed during the erase process. As in the case of switch 31, switches 42 can be any appropriate switching devices. The preferred impedance of device 15 is again at least about 1 MΩ.

Again as in the chain erase case depicted in FIG. 3, the erase process will stop when any one cell 10 in array 40 conducts. This may increase the risk of undererased cells, because of the inherently greater variation to be expected in a larger number of cells 10. Such variation can be accommodated by closer device manufacturing tolerances to decrease such variability.

It should be apparent that using the present invention, one can provide a PLD made from an array of Flash-erasable one-transistor EPROM cells, without the need for select transistors to mask overerased cells, because such overerased cells are substantially avoided.

Thus it is seen that programming methods and apparatus for single-transistor Flash cells in which susceptibility to overerasure is reduced or eliminated, as well as a programmable logic array of one-transistor Flash cells, are provided. One skilled in the art will appreciate that the present invention can be practiced by other than the described embodiments, which are presented for purposes of illustration and not of limitation, and the present invention is limited only by the claims which follow.

What is claimed is:

1. A method of erasing a programmed Flash cell and stopping erasure of said cell on onset of conduction by said cell, said cell having a gate, a source, a drain and a floating gate from which charge must be removed by placing a high potential difference thereacross to erase the cell, said method comprising:
    applying ground potential to said gate;
    applying ground potential to said source; and
    applying a high positive potential to said drain through a high-impedance device connected to said drain; wherein:
    said high positive potential causes electrons to flow off said floating gate to said drain and through said high-impedance device, such that when enough electrons have been removed from said floating gate:
    said cell begins to conduct, and
    current flows through said high-impedance device and said cell and drops most of said high potential across said high-impedance device, insufficient potential remaining across said floating gate to remove additional electrons, whereby erasure is stopped at onset of conduction by said cell.

2. A method of erasing a chain of Flash cells and stopping erasure of said chain of cells on onset of conduction by any cell in said chain, each of said cells having a gate, a source, a drain and a floating gate from which charge must be removed by placing a high potential difference thereacross to erase the cell, the sources of all cells in said chain being connected in common to a source line and the drains of all cells in said chain being connected in common to a drain line, all of said cells being programmed, said method comprising:
    applying ground potential to each of said gates;
    applying ground potential to said source line; and
    applying a high positive potential to said drain line through a high-impedance device connected to said drain line; wherein:
    said high positive potential causes electrons to flow off said floating gates to said drain line and through said high-impedance device, such that when enough electrons have been removed from said floating gate of one of said cells:
    said one of said cells begins to conduct, and
    current flows through said high-impedance device and said cell and drops most of said high potential across said high-impedance device, insufficient potential remaining across said floating gates to remove additional electrons, whereby erasure is stopped at onset of conduction by said cell.

3. A method of erasing an array of Flash cells and stopping erasure of said array of cells on onset of conduction by any cell in said array, each of said cells having a gate, a source, a drain and a floating gate from which charge must be removed by placing a high potential difference thereacross to erase the cell, said cells connected in parallel chains, the sources of all cells in each said chain being connected in common to a respective source line for said chain and the drains of all cells in each said chain being connected in common to a respective drain line for said chain, all of said cells being programmed, said method comprising:
    connecting together said respective drain lines as a common drain line;
    applying ground potential to each of said gates;
    applying ground potential to said source lines; and
    applying a high positive potential to said common drain line through a high-impedance device connected to said common drain line; wherein:
    said high positive potential causes electrons to flow off said floating gates to said common drain line and through said high-impedance device, such that when enough electrons have been removed from said floating gate of one of said cells:
    said one of said cells begins to conduct, and
    current flows through said high-impedance device and said cell and drops most of said high potential across said high-impedance device, insufficient potential remaining across said floating gates to remove additional electrons, whereby erasure is stopped at onset of conduction by said cell.

4. The method of claim 3 wherein said step of applying ground potential to said source lines comprises:
    connecting together said respective source lines as a common source line; and
    applying ground potential to said common source line.

5. Apparatus for erasing a programmed Flash cell and for stopping erasure of said cell on onset of conduction by said cell, said cell having a gate, a source, a drain and a floating gate from which charge must be removed by placing a high potential difference thereacross to erase the cell, said apparatus comprising:
    means for applying ground potential to said gate;
    means for applying ground potential to said source;

high-impedance means for attaching to said drain; and means for applying a high positive potential to said high-impedance means connected to said drain; wherein:

said high positive potential causes electrons to flow off said floating gate to said drain and through said high-impedance device, such that when enough electrons have been removed from said floating gate:

said cell begins to conduct, and current flows through said high-impedance device and said cell and drops most of said high potential across said high-impedance means, insufficient potential remaining across said floating gate to remove additional electrons, whereby erasure is stopped at onset of conduction by said cell.

6. The apparatus of claim 5 wherein said high-impedance means comprises a high-resistance resistor.

7. The apparatus of claim 5 wherein said high-impedance means comprise a transistor.

8. The apparatus of claim 5 wherein said high-impedance means comprises a capacitive pumped circuit.

9. The apparatus of claim 8 wherein said capacitive pumped circuit comprises an oscillator.

10. Apparatus for erasing a chain of Flash cells and for stopping erasure of said chain of cells on onset of conduction by any cell in said chain, each of said cells having a gate, a source, a drain and a floating gate from which charge must be removed by placing a high potential difference thereacross to erase the cell, the sources of all cells in said chain being connected in common to a source line and the drains of all cells in said chain being connected in common to a drain line, all of said cells being programmed, said apparatus comprising:

means for applying ground potential to each of said gates;

means for applying ground potential to said source line of said chain;

high-impedance means for attaching to said drain line; and means for applying a high positive potential to said drain line through high-impedance means connected to said drain line; wherein:

said high positive potential causes electrons to flow off said floating gates to said drain line and through said high-impedance device, such that when enough electrons have been removed from said floating gate of one of said cells:

said one of said cells begins to conduct, and current flows through said high-impedance device and said cell and drops most of said high potential across said high-impedance device, insufficient potential remaining across said floating gates to remove additional electrons, whereby erasure is stopped at onset of conduction by said cell.

11. The apparatus of claim 10 wherein said high-impedance means comprises a high-resistance resistor.

12. The apparatus of claim 10 wherein said high-impedance means comprises a transistor.

13. The apparatus of claim 10 wherein said high-impedance means comprises a capacitive pumped circuit.

14. The apparatus of claim 13 wherein said capacitive pumped circuit comprises an oscillator.

15. Apparatus for erasing an array of Flash cells and for stopping erasure of said array of cells on onset of conduction by any cell in said array, each of said cells having a gate, a source, a drain and a floating gate from which charge must be removed by placing a high potential difference thereacross to erase the cell, said cells connected in parallel chains, the sources of all cells in each said chain being connected in common to a respective source line for said chain and the drains of all cells in each said chain being connected in common to a respective drain line for said chain, all of said cells being programmed, said apparatus comprising:

means for connecting together said respective drain lines as a common drain line;

means for applying ground potential to each of said gates;

means for applying ground potential to said source lines;

high-impedance means for attaching to said common drain line; and means for applying a high positive potential to said common drain line through said high-impedance means connected to said common drain line; wherein:

said high positive potential causes electrons to flow off said floating gates to said common drain line and through said high-impedance device, such that when enough electrons have been removed from said floating gate of one of said cells:

said one of said cells begins to conduct, and current flows through said high-impedance device and said cell and drops most of said high potential across said high-impedance device, insufficient potential remaining across said floating gates to remove additional electrons, whereby erasure is stopped at onset of conduction by said cell.

16. The apparatus of claim 15 wherein said high-impedance means comprises a high-resistance resistor.

17. The apparatus of claim 15 wherein said high-impedance means comprise a transistor.

18. The apparatus of claim 15 wherein said high-impedance means comprises a capacitive pumped circuit.

19. The apparatus of claim 18 wherein said capacitive pumped circuit comprises an oscillator.

20. The apparatus of claim 15 wherein said means for applying ground potential to said source lines comprises:

means for connecting together said respective source lines as a common source line; and means for applying ground potential to said common source line.

* * * * *